(12) United States Patent
Von Zon

(10) Patent No.: US 8,195,423 B2
(45) Date of Patent: Jun. 5, 2012

(54) CALIBRATION OF AN AMR SENSOR

(75) Inventor: Hans Von Zon, Waalre (NL)

(73) Assignee: NXP, B.V. (NL)

( * ) Notice: Subject to any disclaimer, the term of this patent is extended or adjusted under 35 U.S.C. 154(b) by 396 days.

(21) Appl. No.: 12/667,237

(22) PCT Filed: May 8, 2008

(86) PCT No.: PCT/IB2008/051815
§ 371 (c)(1),
(2), (4) Date: Dec. 30, 2009

(87) PCT Pub. No.: WO2009/004502
PCT Pub. Date: Jan. 8, 2009

(65) Prior Publication Data
US 2010/0211345 A1    Aug. 19, 2010

(30) Foreign Application Priority Data
Jul. 3, 2007 (EP) ................................. 07111604

(51) Int. Cl.
*G06F 19/00* (2006.01)
(52) U.S. Cl. ...................................................... 702/154
(58) Field of Classification Search .............. 702/154, 702/150, 182–185, 188
See application file for complete search history.

(56) References Cited

U.S. PATENT DOCUMENTS

| | | |
|---|---|---|
| 5,160,918 A | 11/1992 | Saposnik et al. |
| 2003/0071785 A1 | 4/2003 | Arita et al. |
| 2005/0073302 A1 | 4/2005 | Hibbs et al. |
| 2007/0257885 A1 | 11/2007 | Liberty |
| 2008/0080789 A1* | 4/2008 | Marks et al. ................. 382/296 |
| 2009/0231274 A1* | 9/2009 | Blandin ........................ 345/156 |

FOREIGN PATENT DOCUMENTS

| | | |
|---|---|---|
| EP | 1168234 A2 | 1/2002 |
| WO | 2006/035340 A1 | 4/2006 |
| WO | 2006/035342 A1 | 4/2006 |
| WO | 2006/035350 A1 | 4/2006 |
| WO | 2006/035371 A1 | 4/2006 |
| WO | 2006/090197 A1 | 8/2006 |

OTHER PUBLICATIONS

Caruso, M, J. "Applications of Magnetic Sensors for Low Cost Compass Systems," IEEE, pp. 177-184 (2000).
Petersen, A. "The Magnetoresistive Sensor, A Sensitive Device for Detecting Magnetic-Field Variations," Electronic Component and Applications, vol. 8, No. 4, pp. 222-239 (1988).
International Search Report for Application No. PCT/IB2008/051815 (Nov. 18, 2008).

* cited by examiner

*Primary Examiner* — Edward Raymond
(74) *Attorney, Agent, or Firm* — Kramer & Amado P.C.

(57) ABSTRACT

A joystick module has a joystick and a sensor for generating a signal in response to sensing a magnetic field representative of a position and/or orientation of the joystick. Using a linear dependence of the sensor's sensitivity on a distance between the joystick and the sensor, the sensor's signal representative of a tilt angle of the joystick can be calibrated in a simple manner.

11 Claims, 4 Drawing Sheets

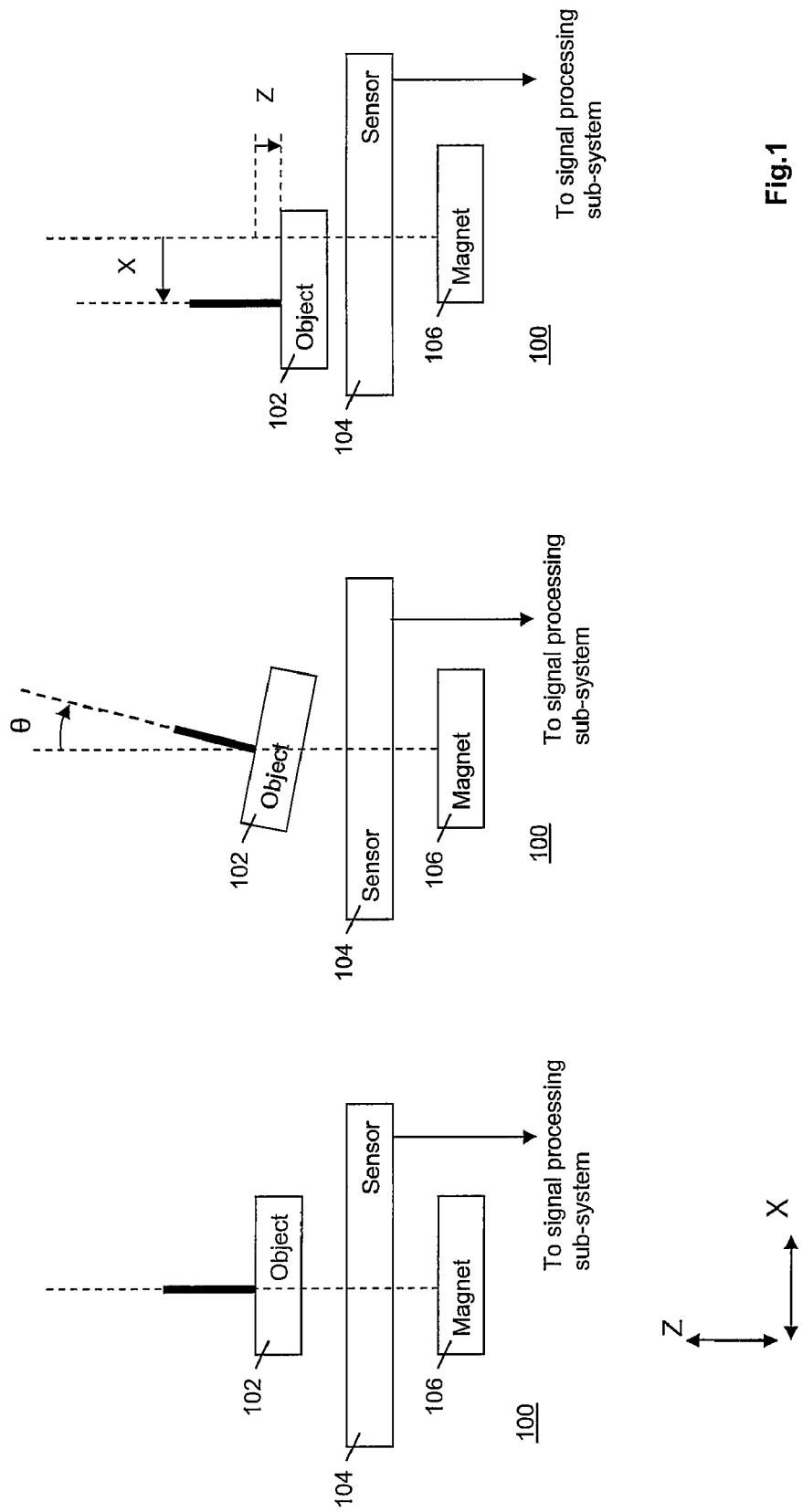

(402) $V_{X\,measured}(\theta, Z) = S(Z) \cdot \theta + \theta_{offset} \cdot [S(Z_0) - S(Z)]$ (404) $V_{X\,out}(\theta, Z) = V_{X\,measured}(\theta, Z) - \theta_{offset} \cdot [S(Z_0) - S(Z)] = S(Z) \cdot \theta$ (406) $dV_Z(Z) / dS(Z) = \alpha = \text{constant}$ (408) $[V_Z(Z_0) - V_Z(Z)] = \alpha \cdot [S(Z_0) - S(Z)]$ (410) $\theta_{offset} = V_X(0, Z_C) / [S(Z_0) - S(Z_C)] = \alpha \cdot V_X(0, Z_C) / [V_Z(Z_0) - V_Z(Z_C)]$ (412) $V_{X\,out}(\theta, Z) = V_{X\,measured}(\theta, Z) - V_X(0, Z_C) \cdot [V_Z(Z_0) - V_Z(Z)] / [V_Z(Z_0) - V_Z(Z_C)]$ (414) $V_{X\,corr}(\theta, Z) = V_{X\,out}(\theta, Z) \cdot S(Z_0) / S(Z)^n$

Fig.4

CALIBRATION OF AN AMR SENSOR

FIELD OF THE INVENTION

The invention relates to a system comprising a signal processing sub-system having a physical object and a sensor for generating a signal in response to sensing a magnetic field component in a reference plane, the signal being indicative of the position and/or orientation of the object with respect to the plane. The invention also relates to a sub-system for use in such a system, to a calibration method for carrying out in such a system, and to software for carrying out he calibration method. The invention is in particular, but not exclusively, interesting to such systems and sub-systems having one or more magneto-resistive sensors.

BACKGROUND ART

Magneto-resistive sensors of the AMR (anisotropic magneto-resistive) type are known for measurement of rotational speed and for angular measurement in automotive applications. Further applications can be found in interesting consumer markets such as, e.g. mobile phones where much larger numbers are involved compared to the automotive industry. Examples of these new applications are small integrated pointer control devices (joysticks), accelerometers or tilt sensors and integrated microphones. These are typically integrated components which can be used in mobile phones or other portable devices such as laptops, PDA's, GPS systems, (remote) controls and digital camera's.

Until now most mobile phones have been equipped with "digital" joysticks which are based on a switching (on/off) mechanism. However, nowadays mobile phone manufacturers are looking into joysticks which provide a full analog signal instead of merely a switching signal, especially for gaming applications and web-browsing on their high-end telephones.

WO2006/035350, of the same inventor and incorporated herein by reference, discloses a sensor module using AMR sensor technology. The module comprises a joystick and a small, integrated, analog, magnetic sensor on a substrate. The joystick can be moved relative to the sensor die. The sensor is sensitive to movements of the joystick in the X-Y plane, i.e., the plane perpendicular to the stick when at rest, and to movements in the Z-direction, i.e., in the direction along the stick when at rest.

The sensor provides a signal proportional to these movements. As this sensor is sensitive to joystick movement perpendicular to the X-Y plane, it can be used for, e.g., a "Press-to-Select"-function or a "Confirm"-function.

SUMMARY OF THE INVENTION

The inventor has realized that the sensitivity of the module, described in WO2006/035350, to movements in the X-Y plane depends on the distance between the joystick and the magnetic sensor. The shorter the distance is between the joystick and the sensor, the higher is the sensitivity to X-Y movements of the joystick. This can, on the one hand, be used as an extra feature of the joystick giving more control to the user. On the other hand, this also may have some drawbacks in practical use. The joystick is typically used to control the movement of a pointer icon across the screen of a display monitor of, e.g., a laptop PC or mobile phone. The sensor's output signal determines the direction of the pointer icon, and also the speed at which it moves over the screen. The sensor's output signal, $V_{out}=S\cdot\theta$, depends on the tilt angle $\theta$ of the joystick relative to the sensor and on the sensitivity S of the sensor. If this sensitivity is affected by the distance between the joystick and the sensor, the output is influenced as well, and therefore the pointer speed. The pointer accelerates when the joystick is pressed because a larger signal is generated due to the increased sensitivity as a result of the shorter distance between joystick and sensor. This is an undesired effect in practical use.

More specifically, the tilt sensitivity S of the joystick, typically expressed in mV/deg, depends on the distance between the joystick and the sensor and increases if this distance is shortened. In the case of an ideal joystick, the output $V_{out}=S\cdot\theta$ is zero Volts if the tilt angle $\theta$ equals zero degrees, and the output remains zero if the distance between joystick and sensor is changed. However, in a manufacturing process, it will be very difficult to make such an ideal joystick. This would require a perfect parallel alignment of the magnetic plate at the bottom of the joystick to the sensor die. Due to tolerances in the suspension of the joystick, in the glued connections, the machining of parts, etc. there will always be a slight misalignment. This misalignment induces a certain tilt-offset, $\theta_{offset}$, of the magnetic plate with respect to the sensor die. This implies that, even if the joystick is not touched ($\theta=0$), a small tilt angle is present and subsequently the output signal of the sensor will be non-zero, $V_{out}=S\cdot(\theta-\theta_{offset})$. The sensitivity of the output signal to the tilt-angle is a function of the distance z between the joystick and the sensor die, S(z). Therefore, if the distance between the joystick and the sensor die changes, the sensitivity changes and, as a result, the output signal also changes. Pressing the joystick in the Z-direction therefore causes an output signal which the laptop or mobile phone interprets as a certain tilt of the joystick. This is an undesired effect because pressing the joystick in the Z-direction now moves or accelerates the cursor or pointer on the display screen.

To illustrate this problem, consider the following numerical example representative of a practical joystick configuration. If the user does not press the joystick, the sensitivity of the sensor is 1.5 mV/deg. A typical maximum tilt angle of the joystick is 2 degrees which will result in an output signal of 3 mV. This output level can be interpreted as, e.g., the maximum speed of the pointer on the display screen. If the joystick is pressed downwards, the sensitivity changes to 5 mV/deg as a result of the shortened distance between the joystick and the sensor die. Assume that the offset error in the tilt angle is, say, 0.5 deg. If the joystick is pressed down without any additional tilting (i.e., $\theta$ remains zero), the output signal will change by $0.5\cdot(1.5-5)=1.75$ mV. The same output level would be obtained if the joystick were tilted over 1.2 deg. Therefore, merely pressing the joystick has the same effect on the control of the pointer as a 1.2 degree tilting of the joystick. This is an undesirable effect One of the solutions to this problem is keeping the cursor in its position when the Z-signal changes rapidly. A rapid change in the Z-signal is then interpreted as a pressing action. This solution requires that the current values of the coordinates or of other parameters of the pointer be stored. If the Z-signal changes rapidly, the pointer coordinates or other parameters (e.g., speed) are kept as stored so that the behavior of the pointer is not affected, e.g., the pointer does not move or is not accelerated when already moving as a result of the detected X-signal and Y-signal at the time of pressing. These signals are then ignored. When the Z-signal is only changing slowly, it is assumed that the pointer is allowed to move under combined control of the X-signal, the Y-signal and the Z-signal as generated by the sensor. This solution may introduce a small delay between joystick movement and cursor movement, dependent on the implementation.

Another solution is using a calibration procedure to determine the tilt-angle offset and to calculate a new output signal for the sensor that reduces or eliminates the vertical movement of the joystick. This solution avoids the delays resulting from the first-mentioned approach.

More specifically, the invention relates to <claim 1>. The system herein comprises, e.g., a mobile phone, a laptop PC or another larger entity (e.g., an automobile) accommodating the sensor, object and calibration means in operational use of the system.

The rationale for the invention is as follows. As mentioned above, the sensitivity S depends on the distance between the object and the reference plane. For ease of illustration, the example is considered wherein the sensor is located in the reference plane, but other configurations work as well, such as having the sensor integrated with the object. In order to have the value of the tilt signal equal zero in the object's rest position and without the object's being tilted, the first quantity is subtracted from the current value. In order to have the thus corrected current value depend linearly on the tilting angle the second quantity is subtracted from the initially corrected value. The second quantity is the product of $\theta_{offset}$ and the difference in the sensitivity in the rest position and in the current position along the reference axis. The invention is based on the insight that in good approximation the distance signal is a linear function of the distance. This implies that a difference between sensitivity values at different distances can be expressed in differences of the distance signal measurements. Further, $\theta_{offset}$ can be expressed as the ratio between, on the one hand, the value of the tilt signal if the angle is zero and the distance has a predetermined length, and the difference of the sensitivity values in the rest position and the predetermined distance. As a result, the second quantity can be expressed entirely in signal values supplied by the sensor, so that the calibration process is simple.

The calibration means of the sub-system comprises, e.g., a data processor under software control, or a gate array dedicated to carrying out the simple signal processing.

In an embodiment, the sub-system comprises means for constraining the object to a zero tilt angle when the object is at the distance of predetermined length. This embodiment ensures an accurate value of zero for the term that represents the tilt signal when the object is at the distance of the predetermined length.

In a further embodiment, the calibration means is further operative to scale the corrected value of the tilt signal by a factor. The factor is a further ratio of a third term and a fourth term. The third term is representative of a value of a sensitivity of the sensor when the object is in the rest position. The fourth term is representative of a value of the sensitivity of the sensor when the object is in a current position. The fourth term is, e.g., the current sensitivity value of the current sensitivity value raised to the power of "n", wherein n may be larger than unity. In this further embodiment, the effect of the decreasing distance on the tilt signal is reduced, when the object is pressed and tilted.

The invention also relates to a calibration method for being carried out in a signal processing system, and to software with instructions to carry out such method. As to the latter, the invention can be commercially exploited in the form of providing software, e.g., as an after-market add-on, to be installed in the signal processing system with aforesaid object-sensor combination. The signal processing system is comprised in, e.g., a mobile device such as a mobile telephone or a laptop PC, and the object comprises a joystick in the user interface. The software is then installed at the mobile device's data processing system. As a result of the software, the user-friendliness of the user interface is greatly improved in operational use of the software.

The invention also relates to a sub-system comprising the object, the sensor and the calibration means as specified above. Such a sub-system can be commercially exploited as a module for use in a larger system, e.g., a mobile phone, a laptop PC, or in automotive applications, etc.

BRIEF DESCRIPTION OF THE DRAWING

The invention is explained in further detail, by way of example and with reference to the accompanying drawing, wherein:

FIG. 1 is a set of block diagrams of a sensor system in the invention;

FIG. 4 gives formulae that explain the relationship between various physical quantities of the sensor system;

Throughout the Figures, similar or corresponding features are indicated by same reference numerals.

DETAILED EMBODIMENTS

Figure 3:
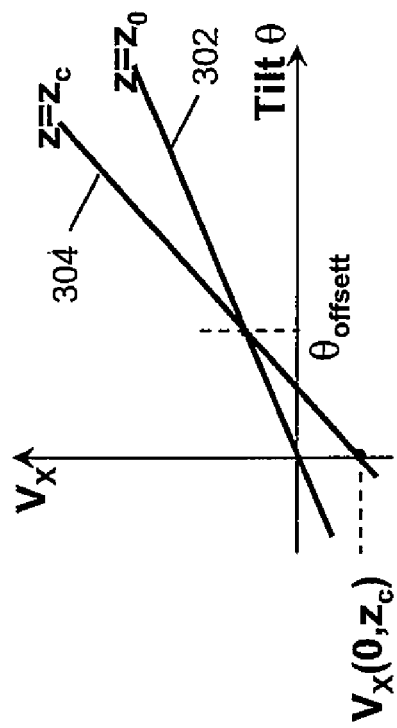
FIGS. 2 and 3 are diagrams illustrating aspects of the behavior of the sensor in the system.

In an example embodiment, a joystick module has a joystick and a sensor for generating a signal in response to sensing a magnetic field representative of a position and/or orientation of the joystick. Using a linear dependence of the sensor's sensitivity on a distance between the joystick and the sensor, the sensor's signal representative of a tilt angle of the joystick can be calibrated in a simple manner.

FIG. 1 are block diagrams of a sensor system 100 comprising an object 102, e.g., a joystick, that can move relative to a sensor 104 in at least the X-Z plane as indicated, and a field generator 206 for generating a field, e.g., a magnetic field. Different positions and/or orientations of object 102 relative to generator 106 give rise to differences in the fields that are sensed by sensor 104. Sensor 104 is connected, e.g., by a galvanic, optic or wireless connection to a signal processing sub-system (not shown) that processes the sensor output signal. The signal can be used to control a position of a cursor on a display screen, or to control another functionality through a sensor system based on measuring changes in relative position or relative orientation of a physical object 102.

The diagrams of FIG. 1 illustrate different orientations and positions of object 102 relative to sensor 104. In FIG. 1, generator 106 is mounted stationary relative to sensor 102 as a component separate from object 102. Alternatively, generator 106 can be mounted in, or on, object 102, so that object 102 and generator 106 can move in unison relative to sensor 104. Alternatively, sensor 104 can be mounted in or on object 102 so that these components can move together relative to generator 106. In all configurations, a relative change in position or in orientation of object 102 gives rise to a difference in the field as sensed by sensor 104. The sensed differences can then be processed as indicative of the relative position or relative movement of object 102. FIG. 1 shows only one of the possible configurations. For further implementation details see, e.g., WO2006/035350 discussed above.

In the following, the output signal of sensor 104, indicative of a change of position or orientation of object 102 in the X-direction, is referred to a $V_X$, and the output signal of sensor

104, indicative of a change of position or orientation in the Z-direction, is referred to as $V_Z$.

Figure 2:
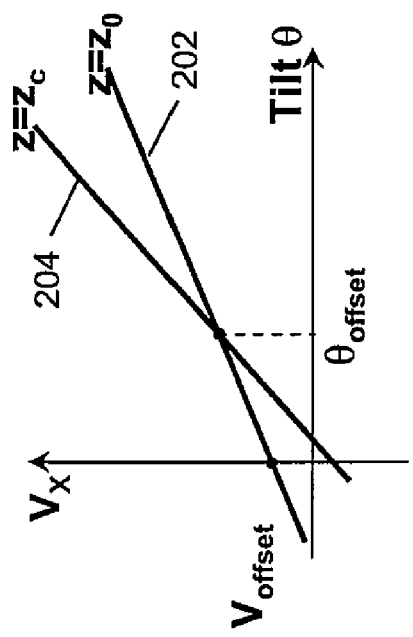

FIG. 2 is a diagram illustrating a general tilt-output characteristic of an un-calibrated sensor system, e.g., wherein object 102 comprises a joystick, The system has an offset error $V_{offset}$ in the output voltage $V_X$, and an offset error $\theta_{offset}$ in the tilt angle $\theta$. A linear dependence is assumed between tilt angle $\theta$ and output voltage $V_X$. The diagram of FIG. 2 illustrates a line 202 for the case wherein the distance Z between sensor 104 and object 102 equals $Z_0$, which represents the distance between sensor 104 and object 102 when object 102 is at rest, e.g., not touched by the user. The diagram of FIG. 2 also illustrates a line 204 for the case wherein the distance between sensor 104 and object 102 equals $Z_C$ that is smaller than $Z_0$. The slopes of lines 202 and 204 differ as a result of the difference in sensitivity due to the difference in distance. The sensitivity is higher for a shorter distance. Both offset-errors $V_{offset}$ and $\theta_{offset}$ are unknown in advance because they are caused by, e.g., tolerances in the manufacturing process.

If object 102 is in its rest position, i.e., it is not touched by the user, an output voltage $V_{offset}$ is present. Since it is desirable to have an output voltage which is zero if object 102 is at rest, an offset-voltage can be subtracted from this value such that the final result is zero volts. A simple procedure measures the output voltage $V_X$ for object 102 at rest and stores this measured value as $V_{offset}$. Such a procedure is carried out, e.g., when system 100 is switched on for the first time or when a calibration procedure is started. This stored value is then subtracted from the values actually measured in operational use. After this first calibration step, the output characteristic is changed into that of the diagram of FIG. 3. Line 202 is transformed into line 302 and line 204 is transformed into line 304. Now, output voltage $V_X$ for $\theta=0$ and $Z=Z_0$ is zero.

However, when object 102 is pressed towards sensor 104 without tilting, the distance changes to $Z=Z_C$ and output voltage $V_X$ changes to $V_X(0,Z_C)$. This signal is interpreted by the signal processing sub-system as a change in the tilt angle $\theta$ as a result of the tilt-offset error $\theta_{offset}$ being non-zero.

The set of tilt-angle/voltage characteristics of FIG. 3 can be represented by expression (402) in FIG. 4. The various quantities appearing therein have been introduced above.

The desired set of characteristics, however, has the output voltage $V_X$ only depend on the tilt angle $\theta$ and the sensitivity $S(Z)$, i.e., $V_X=S(Z)\cdot\theta$. These desired characteristics can be obtained if in expression (402) the term that includes tilt-offset error $\theta_{offset}$ is subtracted from the measured voltage $V_X$. That is, an additional calibration procedure is needed. The desired characteristics are represented by expression (404) in FIG. 4.

Figure 5:
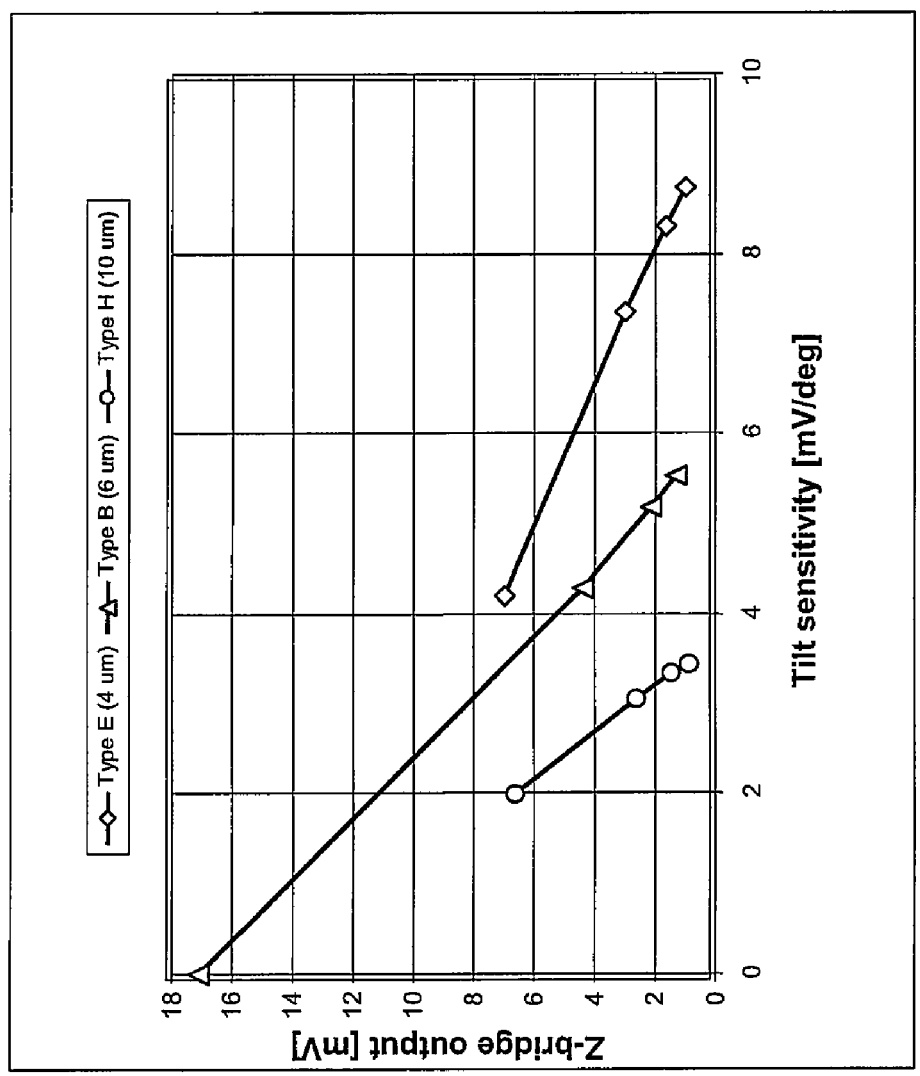
FIG. 5 is a diagram of the dependence of an output signal of the sensor on the sensitivity for different sensor implementations.

Generally, the tilt-offset error $\theta_{offset}$ and the sensitivity $S(Z)$ are not well known. Below is shown that the additional calibration procedure can be very simple. This is based on the insight that the relationship between the output voltage $V_Z(Z)$ of sensor 104 and the tilt-sensitivity in the X direction is linear in good approximation. In an embodiment of the invention, sensor 104 comprises a bridge configuration of AMR elements, as disclosed in WO2006/035350, for sensing the magnetic field components in the X-direction and the Z-direction. A numerical simulation in the diagram of FIG. 5 shows that there is indeed a linear relation to be expected between the common-mode resistance and the tilt sensitivity $S(Z)$. However, it is not trivial to understand why this relationship is linear since the tilt sensitivity depends on the shape of the magnetic field lines of the finite permanent magnet 106, and the common-mode resistance of the Z-bridge depends on the strength of the magnetic field components in the reference plane (referred to as "radial field"). The reference plane is here the plane of sensor 104. The tilt sensitivity changes roughly inversely proportionally to the distance between object 102 and sensor 104, and the common-mode resistance of the bridge changes inversely proportionally to the magnetic field in the plane. The linear relationship is hidden in the fact that (roughly) the radial field strength in the plane decreases when the distance between object 102 and sensor 104 is decreased. That indeed the radial field strength decreases can be understood from the fact that object 102 can be considered a mirror image of magnet 106 but with the opposite polarity. The closer object is to magnet 106, the more the radial field is compensated by the mirror image with the opposite polarity, thus decreasing the radial field strength.

Expressions (406) and (408) represent this linear dependence of the distance signal $V_Z(Z)$ on the sensitivity $S(Z)$. For a bridge configuration as shown in WO2006/035350, with a magnetic line width of 4 μm the linearity factor a has a value of −1.31 degree. The diagram of FIG. 5 represents the results of a numerical simulation carried out for magnetic line widths of 4 μm, 6 μm and 10 μm.

The proposed calibration procedure now comprises following steps. In a first step, sensor signal $V_X(\theta, Z)$ is compensated so that $V_X(0,Z_0)$ is zero. This has been discussed above with reference to FIGS. 2 and 3. In a next step, object 102 is moved towards sensor 104 without tilting ($\theta=0$) until it has covered a predetermined distance $Z_C$. Output signal $V_X$ then assumes the value $V_X(0,Z_C)$, and output signal $V_Z$ assumes the value $V_Z(Z_C)$. A tiny tilt during this movement results in a value for $V_X(0,Z_c)$ which is slightly off, which means that the calibration will be less effective. If necessary, the construction of object 102 can be made such that if object has moved to predetermined distance $Z_C$, no tilt is possible anymore due to, e.g., mechanical constraints. For example, when object 102 has moved to distance $Z_C$ it is at least partly gripped by an encasing whose shape matches that of object 102 so as to minimize or eliminate lateral movement of object 102. Alternatively, object 102 is made hollow and fits snuggly over a thorn fixed in the reference plane when object 102 is at distance $Z_C$.

From these measurements, tilt angle offset $\theta_{offset}$ can be determined according to expression (410). Substituting expression (408) into expression (402) for $\theta=0$ and $Z=Z_C$ results then in expression (410) for $\theta_{offset}$. Using expressions (408) and (410), expression (404) can transformed into expression (412). Expression (412) gives the calibrated $V_X(\theta, Z)$ signal in terms of other signals available from sensor 104.

Although above example refers to only the X-direction and Z-direction, it is clear that a similar calibration can be carried out as well for the signal $V_Y$ in Y-direction within the reference plane, the Y-direction being perpendicular to the X-direction and the Y-direction.

The above mentioned calibration procedure prevents that an exactly vertical movement of object 102 results in seriously affecting the $V_X$ (and $V_Y$) output signals. However, when object 102 is moved along the reference axis while being tilted, sensitivity S will increase, still resulting in a larger distortion of the $V_X$ (and $V_Y$) output signals the farther object 102 moves towards sensor 104. This is also an unwanted effect. Since it is roughly known how sensitivity $S(Z)$ depends on the distance, one could use output signal $V_Z$ (Z) of sensor 104 to calculate a correction factor such that sensitivity $S(Z)$ does not increase or increases only slightly under these circumstances. A possible correction approach is given in expression (414), using expression (408) to derive sensitivity $S(Z)$. If the exponent "n" is set to unity, it is clear from expression 404 that the dependence on Z has been removed. In order to apply this approach, it is necessary to know the values of α and of S(Z₀) in expression (408). Typical values for α and S(Z₀) in the sensor used in WO2006/035350 are α=−1.31 degree and S(Z₀)=1.5 mV/degree. If exponent "n" is increased, $V_{X\ corr}$ in expression (414) is made less susceptible to the increasing sensitivity as the distance gets shorter. The value of "n" could be set in operational use depending on the application and context of usage.

Although in this text reference is made to only the X-direction and Z-direction, it is clear that a similar calibration can be carried out for the Y-direction in the reference plane as well, the Y-direction being perpendicular to the X-direction and the Y-direction.

The invention claimed is:

1. A system comprising:
    a signal processing sub-system having a physical object and a sensor for generating a signal in response to sensing a magnetic field component in a reference plane, the magnetic field component being representative of at least one of a position and an orientation of the physical object relative to the reference plane, wherein:
    the sub-system is configured for constraining movement of the object to being tilted with respect to a reference axis, substantially perpendicular to the reference plane, and to being moved along the reference axis;
    the sensor is operative to generate a distance signal representative of a distance over which the object has moved along the reference axis with respect to a rest position;
    the sensor is operative to generate a tilt signal representative of a tilt angle of the object with respect to the reference axis;
    the sub-system has a calibrating device that calibrates the tilt signal;
    the calibration device is operative to generate a corrected value of the tilt signal by of subtracting a first quantity and a second quantity from a current value of the tilt signal, wherein:
    the first quantity is representative of a value of the tilt signal when the object is in the rest position and the tilt angle is zero;
    the second quantity is a product of a first factor and a second factor;
    the first factor is representative of a value of the tilt signal when the tilt angle is zero and the distance has a predetermined length;
    the second factor is representative of a ratio of a first term and a second term;
    the first term is a difference between a value of the distance signal when the object is in the rest position, and a current value of the distance signal; and
    the second term is a difference between the value of the distance signal when the object is in the rest position and a value of the distance signal when the distance has the predetermined length.

2. The system of claim 1, wherein the sub-system comprises a structure that constrains the object to a zero tilt angle when the object is at the distance of the predetermined length.

3. The system of claim 1, wherein:
    the calibration device is further operative to scale the corrected value of the tilt signal by a factor;
    the factor is a further ratio of a third term and a fourth term;
    the third term is representative of a value of a sensitivity of the sensor when the object is in the rest position; and
    the fourth term is representative of a value of the sensitivity of the sensor when the object is in a current position.

4. The system of claim 1, wherein the object comprises a multi-axis controller.

5. A signal processing sub-system included in the system of claim 1.

6. A calibration method for being carried out in a signal processing sub-system, wherein:
    the sub-system comprises a physical object and a sensor for generating a signal in response to sensing a magnetic field component in a reference plane, the magnetic field component being representative of at least one of a position and an orientation of the physical object relative to the reference plane;
    the sub-system is configured for constraining movement of the object to being tilted with respect to a reference axis, substantially perpendicular to the reference plane, and to being moved along the reference axis;
    the sensor is operative to generate a distance signal representative of a distance over which the object has moved along the reference axis with respect to a rest position;
    the sensor is operative to generate a tilt signal representative of a tilt angle of the object with respect to the reference axis; and
    the method comprises generating a corrected value of the tilt signal by subtracting a first quantity and a second quantity from a current value of the tilt signal;
    the first quantity is representative of a value of the tilt signal when the object is in the rest position and the tilt angle is zero;
    the second quantity is a product of a first factor and a second factor;
    the first factor is representative of a value of the tilt signal when the tilt angle is zero and the distance has a predetermined length;
    the second factor is representative of a ratio of a first term and a second term;
    the first term is a difference between a value of the distance signal when the object is in the rest position, and a current value of the distance signal; and
    the second term is a difference between the value of the distance signal when the object is in the rest position and a value of the distance signal when the distance has the predetermined length.

7. The method of claim 6, further comprising constraining the object to a zero tilt angle when the object is at the distance of the predetermined length.

8. The method of claim 6, further comprising scaling the corrected value of the tilt signal by a factor, wherein:
    the factor is a further ratio of a third term and a fourth term;
    the third term is representative of a value of a sensitivity of the sensor when the object is in the rest position;
    the fourth term is representative of a value of the sensitivity of the sensor when the object is in a current position.

9. The method of claim 6, wherein the object comprises a multi-axis controller.

10. A storage device containing software for carrying out a calibration method in a signal processing sub-system, wherein:
    the sub-system comprises a physical object and a sensor for generating a signal in response to sensing a magnetic field component in a reference plane, the magnetic field component being representative of at least one of a position and an orientation of the physical object relative to the reference plane;
    the sub-system is configured for constraining movement of the object to being tilted with respect to a reference axis, substantially perpendicular to the reference plane, and to being moved along the reference axis;

the sensor is operative to generate a distance signal representative of a distance over which the object has moved along the reference axis with respect to a rest position;

the sensor is operative to generate a tilt signal representative of a tilt angle of the object with respect to the reference axis;

the software comprises instructions for generating a corrected value of the tilt signal by subtracting a first quantity and a second quantity from a current value of the tilt signal, wherein:

the first quantity is representative of a value of the tilt signal when the object is in the rest position and the tilt angle is zero;

the second quantity is a product of a first factor and a second factor;

the first factor is representative of a value of the tilt signal when the tilt angle is zero and the distance has a predetermined length;

the second factor is representative of a ratio of a first term and a second term;

the first term is a difference between a value of the distance signal when the object is in the rest position, and a current value of the distance signal; and the second term is a difference between the value of the distance signal when the object is in the rest position and a value of the distance signal when the distance has the predetermined length.

11. The storage device of claim 10, comprising further instructions for scaling the corrected value of the tilt signal by a factor, wherein:

the factor is a further ratio of a third term and a fourth term;

the third term is representative of a value of a sensitivity of the sensor when the object is in the rest position;

the fourth term is representative of a value of the sensitivity of the sensor when the object is in a current position.

* * * * *